(12) United States Patent
Koinuma et al.

(10) Patent No.: US 6,855,972 B2
(45) Date of Patent: Feb. 15, 2005

(54) COMPOSITE INTEGRATED CIRCUIT AND ITS FABRICATION METHOD

(75) Inventors: Hideomi Koinuma, Tokyo (JP); Masashi Kawasaki, Sagamihara (JP); Toyohiro Chikyow, Tsukuba (JP); Yoshiyuki Yonezawa, Yokosuka (JP); Yoshinori Konishi, Yokosuka (JP)

(73) Assignees: National Institute for Materials Science, Ibaraki (JP); Tokyo Institute of Technology, Tokyo (JP); Fuji Electric Corporate Research and Development, Kanagawa (JP)

(*) Notice: Subject to any disclaimer, the term of this patent is extended or adjusted under 35 U.S.C. 154(b) by 0 days.

(21) Appl. No.: 10/166,055

(22) Filed: Jun. 11, 2002

(65) Prior Publication Data

US 2003/0001232 A1 Jan. 2, 2003

(30) Foreign Application Priority Data

Jun. 12, 2001 (JP) .................................. 2001-177467

(51) Int. Cl.[7] ...................... H01L 31/119; H01L 29/00
(52) U.S. Cl. ................................ 257/295; 257/532
(58) Field of Search ................ 257/295–310, 257/532–535; 438/239–254

(56) References Cited

U.S. PATENT DOCUMENTS 5,909,033 A * 6/1999 Koga et al. .................. 257/10

OTHER PUBLICATIONS

"Room–Temperature Epitaxial Growth of $CeO_2$ Thin Films on Si(111) Substrates for Fabrication of Sharp Oxide/Silicon Interface" Yoshimoto et al., Japan Journal Applied Physics, vol. 34, pp. L688–L690, Jun. 1, 1995.

"Crystalline Oxides on Silicon: The First Five Monolayers." McKee et al., Physical Review Letters, vol. 81, No. 14, Oct. 5, 1998.

\* cited by examiner

*Primary Examiner*—Cuong Nguyen
(74) *Attorney, Agent, or Firm*—Venable LLP; Marina V. Schneller

(57) ABSTRACT

A composite integrated circuit is characterized in that to put an oxide thin film into practical use as an electronic device, a highly crystalline oxide thin film is grown on a silicon substrate. A MOS circuit and a thin film capacitor are formed independently, and the two substrates are laminated using an epoxy resin. They are connected through buried wiring, thereby constituting a composite circuit package. As a second substrate 1a, a (110) plane orientation silicon substrate is used which differs from the IC substrate with a (100) plane. On the (110) silicon substrate after the termination processing, a dielectric layer is film deposited, followed by forming an upper electrode, and by forming a thin film coil. Insulating magnetic gel is filled between coil wires and its upper portion. Thus, the fabrication process of the thin film coil and the composite integrated circuit is completed.

6 Claims, 4 Drawing Sheets

COMPOSITE INTEGRATED CIRCUIT AND ITS FABRICATION METHOD

This application is based on Patent Application No. 2001-177467 filed Jun. 12, 2001 in Japan, the content of which is incorporated hereinto by reference.

BACKGROUND OF THE INVENTION

1. Field of the Invention

The present invention relates to a composite integrated circuit and its fabrication method, and more particularly to an oxide composite integrated circuit and its fabrication method enabling oxide thin films to be put to practical use as electronic devices.

2. Description of the Related Art

Generally, oxide thin films have a wide variety of physical properties such as dielectric, magnetic, superconducting properties, and are applicable to various electronic devices. To derive from these oxide thin films the characteristics equivalent to those of bulk crystals, it is essential for them to be epitaxially grown on a well controlled crystalline substrate. Conventional oxide substrates, however, are costly, and are unsuitable to produce on a large scale.

As mobile devices have been developed recently, further progress has been made in miniaturization of electronic circuits. In conjunction with this, it becomes more important to miniaturize capacitors as essential components for various circuits. At present, most electronic circuits are based on silicon, and hence when considering the miniaturization and monolithic devices such as thin film capacitors, it is necessary to merge them with the conventional silicon process.

Thus, trials to epitaxially grow oxide thin films on silicon substrates have been made intensively. In particular, as for the gate oxide films as a substitute for $SiO_2$, various trials have been made such as $Ta_2O_5$ as high-k material. However, as is widely known, since silicon substrate surfaces have very high activity, it is extremely difficult to grow oxide thin films on interfaces without $SiO_2$.

Up to now, using (111) silicon substrate, Yoshimoto et al. of Tokyo Institute of Technology have succeeded in the film deposition of (111) $CeO_2$ without generating any $SiO_2$ film. In addition, Mckee et al. in Oak Ridge National Institute have succeeded in immediate film deposition of $SrTiO_3$ by suppressing the activity by forming SrSi on (100) silicon surface.

The foregoing reports, however, discloses only observations carried out on a lattice image level, and no reports have been made that the epitaxial growth was achieved successfully in an millimeter order or on the entire surface of a wafer. This is probably because the epitaxial growth on silicon must consider not only the lattice matching within a surface, but also the lattice matching in the direction of the film thickness.

FIG. 2 is a schematic diagram showing an example of the epitaxial growth when $SrTiO_3$, one of the oxide thin films, is grown on a (100) silicon substrate with a single step. A one-molecular layer of the oxide thin film of STO is about 4 Å, but a single step level difference of the (100) silicon substrate is 1.38 Å. Thus, when the oxide thin film is grown on the substrate, the lattice will deviate every step, bringing about an anti-phase boundary 18, and probably resulting in a microcrystal. In FIG. 2, the reference numeral 16 designates a (100) silicon single step, and 17 designates a (100) $SrTiO_3$ single step.

Since the current silicon process is optimized for the most stable (100) substrates, there is no freedom of substrate selection for the film deposition of the oxide thin films when applying them to monolithic devices. For example, when growing $CeO_2$ on (100) silicon, a (110) $CeO_2$ surface grows, causing a twin, resulting in a microcrystal.

SUMMARY OF THE INVENTION

The present invention is implemented to solve the foregoing problems. Therefore, an object of the present invention is to provide a composite integrated circuit and its fabrication method capable of increasing a degree of freedom of substrate selection to put oxide thin films into practical use as electronic devices.

To accomplish the object, according to a first aspect of the present invention, there is provided a composite integrated circuit comprising: a semiconductor silicon substrate; and an oxide thin film that has an electrical, magnetic or optical function, and is formed on the semiconductor silicon substrate, on a surface of the semiconductor silicon substrate subjected to termination, or a buffer layer formed on the semiconductor silicon substrate, wherein the semiconductor silicon substrate consists of a (110) silicon substrate with a double step surface.

Thus using the (110) silicon substrate and forming the double step surface to achieve the lattice matching between the silicon substrate and the oxide thin film in the direction of the film thickness make it possible to align the height of the step of the silicon substrate with the height of the one-molecular layer of the oxide thin film.

According to a second aspect of the present invention, there is provided a composite integrated circuit comprising: a first semiconductor substrate having its first principal surface provided with an integrated circuit; a second semiconductor substrate having its first principal surface provided with a thin film having an electrical, magnetic or optical function; and a structure for adhering a second principal surface of the first semiconductor substrate to a second principal surface of the second semiconductor substrate, wherein the first semiconductor substrate and the second semiconductor substrate are laminated to have different plane orientations.

Here, the oxide thin film layer may be epitaxially grown with respect to the semiconductor silicon substrate by higher-order epitaxy.

The second semiconductor substrate may consist of a conductive substrate.

According to a third aspect of the present invention, there is provided a fabrication method of a composite integrated circuit including a first semiconductor substrate having its first principal surface provided with an integrated circuit; a second semiconductor substrate having its first principal surface provided with a thin film having an electrical, magnetic or optical function; and a structure adhering a second principal surface of the first semiconductor substrate to a second principal surface of the second semiconductor substrate, the fabrication method of the composite integrated circuit comprising: a first step of adhering the first semiconductor substrate to the second semiconductor substrate such that their plane orientations differ from each other; a second step of making a surface of the second semiconductor substrate a double step surface; a third step of performing cleaning process of RCA of the second semiconductor substrate; a fourth step of performing termination processing to suppress activity of the cleaning surface obtained by the third step; a fifth step of sputtering a dielectric layer on the second semiconductor substrate passing through the termination processing of the fourth step; a sixth step of forming an upper electrode on the dielectric layer formed at the fifth step; and a seventh step of molding a thin film coil formed on the upper electrode formed at the sixth step with a mold layer.

According to the present invention, it is possible to match the lattice constants in the direction of the film thickness by making the (110) silicon surface the double steps, and to epitaxially grow the oxide thin film on the silicon, thereby enabling the oxide thin film to be applied to various devices. In addition, since the composite integrated circuit comprises: the first semiconductor substrate having its first principal surface provided with an integrated circuit; the second semiconductor substrate having its first principal surface provided with a thin film having an electrical, magnetic or optical function; and the structure for adhering a second principal surface of the first semiconductor substrate to a second principal surface of the second semiconductor substrate so that the first semiconductor substrate and the second semiconductor substrate are laminated to have different plane orientations, the epitaxial growth of the oxide thin film on the silicon becomes possible, enabling the application of the oxide thin film to various devices.

Furthermore, by forming the composite integrated circuit including the thin film capacitor, thin film coil and integrated circuit on a single substrate, or on two substrates laminated, they can be configured as a composite integrated circuit package. For example, functions required as a DC—DC converter can be implemented in a single chip, thereby being able to sharply miniaturize mobile devices including the DC—DC converter. Moreover, the equivalent series resistance of the capacitor can be suppressed to a low value by making the substrate low-resistance, which can solve a problem of a conventional thin film capacitor.

The above and other objects, effects, features and advantages of the present invention will become more apparent from the following description of embodiments thereof taken in conjunction with the accompanying drawings.

DETAILED DESCRIPTION OF PREFERRED EMBODIMENTS

The embodiments in accordance with the present invention will be described with reference to the accompanying drawings.

First, with respect to a concept of epitaxially growing an oxide thin film layer on a silicon substrate with double steps by higher-order epitaxy, explanation will be provided below using FIGS. 3 and 4.

Figure 3:
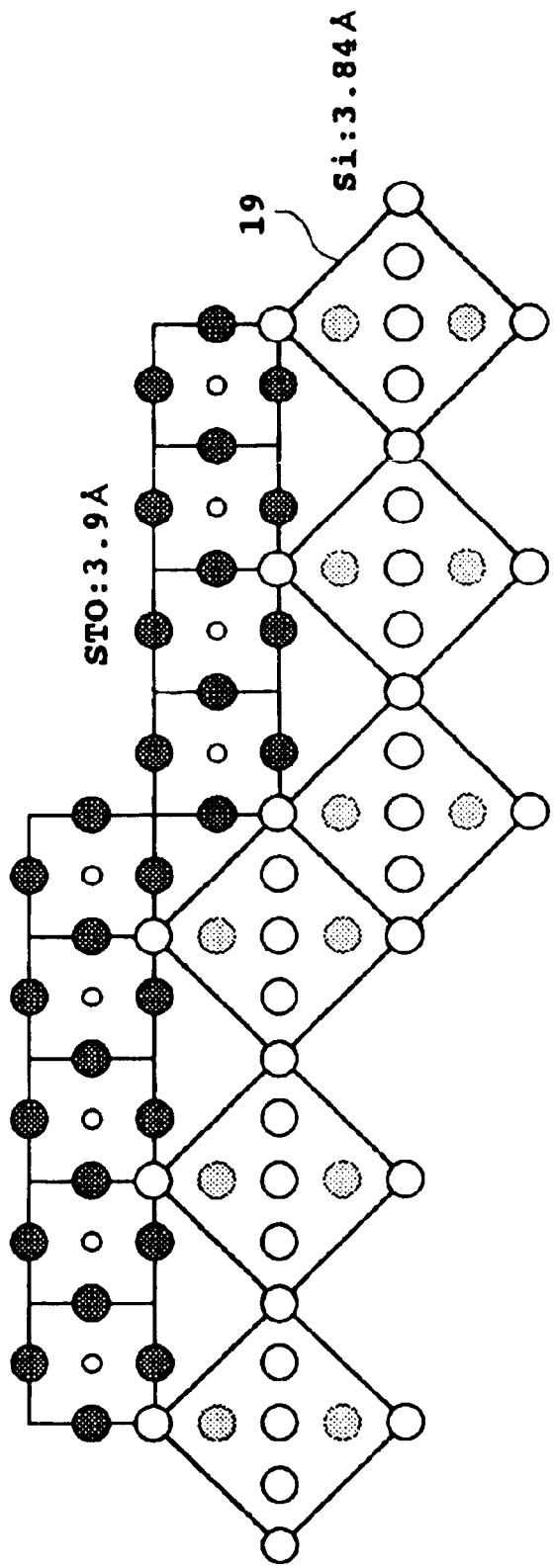
FIG. 3 is a schematic diagram showing an example of the epitaxial growth of an $SrTiO_3$ on a (110) silicon surface with double steps, which is seen from the direction of (100) silicon.
Figure 4:
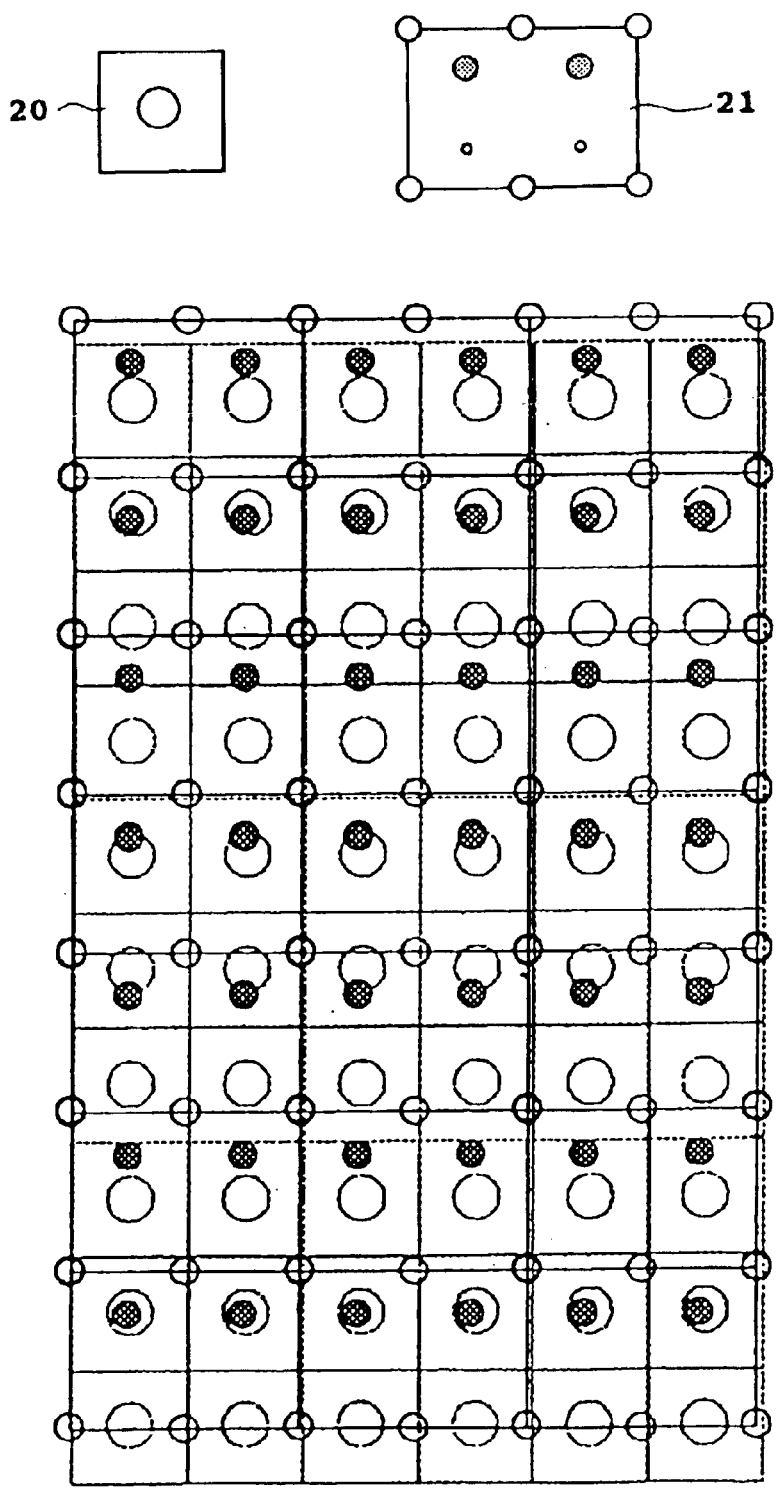
FIG. 4 is a diagram showing a state of the lattice matching within a surface.

FIG. 3 is a schematic diagram illustrating an example of the epitaxial growth of an $SrTiO_3$ on a (110) silicon surface with double steps, which is seen from the direction of (100) silicon. In FIG. 3, a reference numeral 19 denotes (110) silicon double steps. Further, FIG. 4 is a diagram illustrating a state of lattice matching within a surface. A reference numeral 20 denotes a (100) $SrTiO_3$ surface, and a reference numeral 21 denotes a (110) silicon surface. As shown in FIG. 4, the (110) silicon surface 21 has a unit cell in the form of a 5.43 Å×7.68 Å rectangle, while the (100) $SrTiO_3$ surface 20 is in the form of a 3.9 Å×3.9 Å square. In FIG. 4, a position of oxygen is indicated by a black circle. When these are combined as shown in the figure, there occurs an oxygen position coincidence (match) on the basis of five periods of the (110) silicon and seven periods of the (100) $SrTiO_3$ in a vertical direction, while there occurs an oxygen position match on the basis of one period of the (110) silicon and two periods of the (100) $SrTiO_3$ in a horizontal direction. In other words, the lattice matching within a surface allows to epitaxially grow the oxide thin film layer by higher-order epitaxy.

Figure 1:
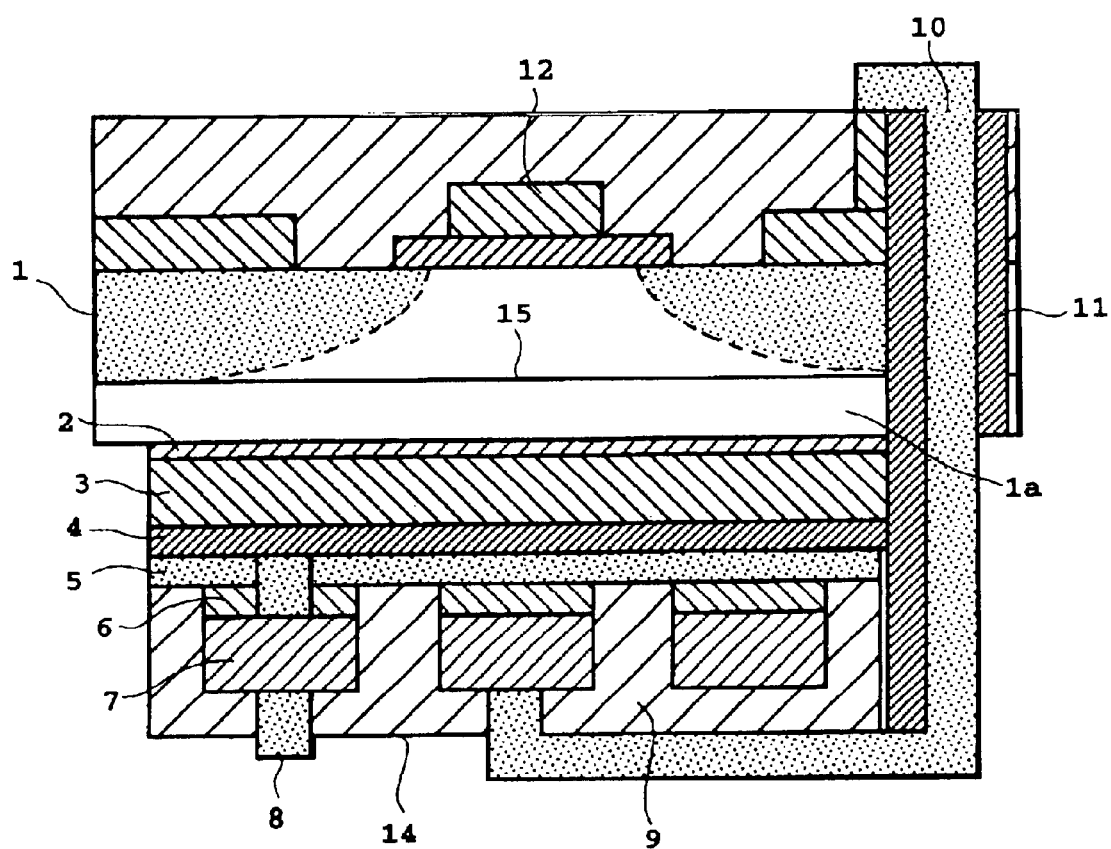
FIG. 1 is a cross-sectional view showing a composite integrated circuit in accordance with the present invention.
Figure 2:
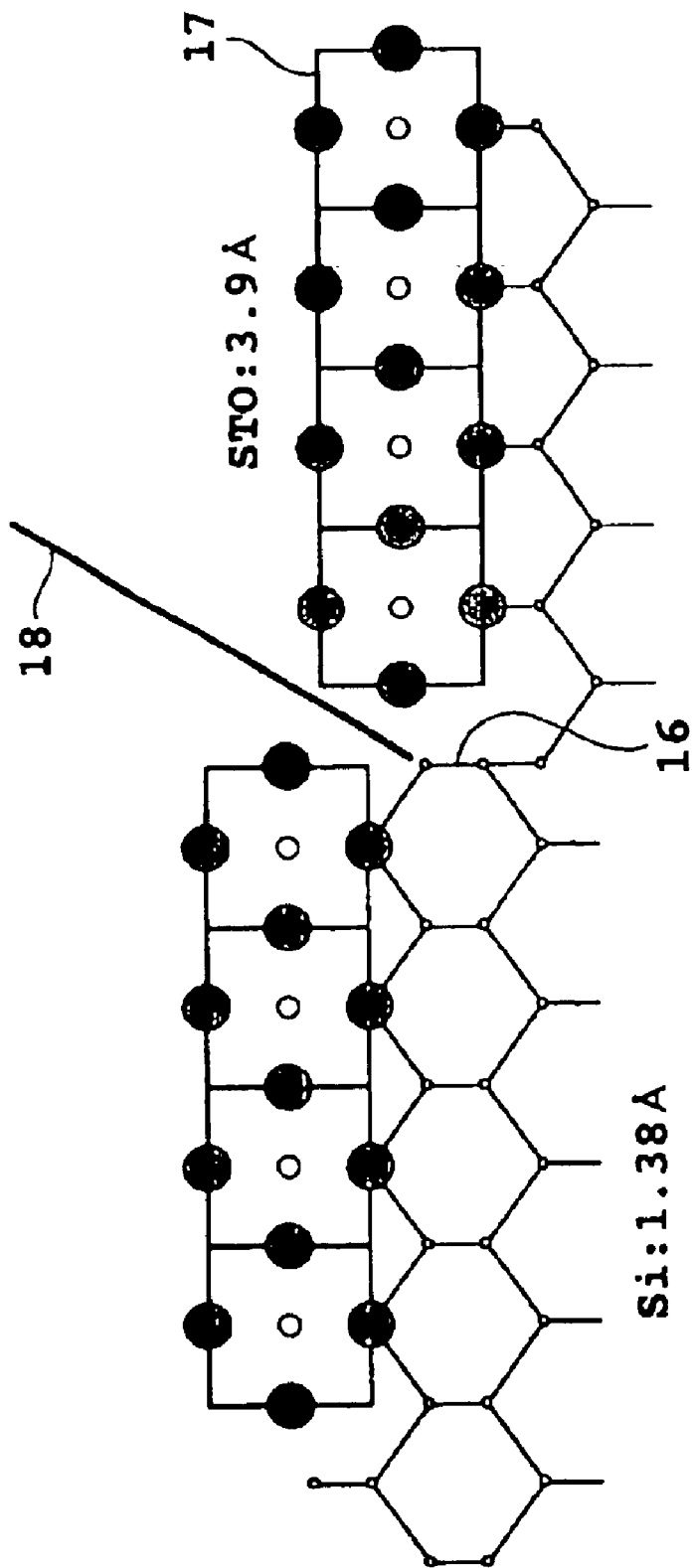
FIG. 2 is a schematic diagram showing an example of the epitaxial growth of $SrTiO_3$, one of the oxide thin films, on a (100) silicon substrate with a single step.

FIG. 1 is a cross-sectional view showing a composite integrated circuit in accordance with the present invention. FIG. 1 shows a composite integrated circuit that monolithically integrates a first IC substrate 1 on which a MOS circuit is formed, and a second IC substrate 1a on which oxide thin film devices are formed including a thin film capacitor and a thin film coil 7. The MOS circuit and thin film capacitor are formed independently, and the two IC substrates are laminated by an epoxy resin 15. Then they are connected by buried wiring 10 such as poly-silicon, thereby configuring the composite circuit package. The two substrates 1 and 1a can be made thinner using CMP (Chemical Mechanical Polishing).

As the second substrate 1a, a (110) silicon substrate is used with a different plane orientation from that of the IC side (100) substrate. The (110) silicon substrate has its surface made double steps by the following method. A first method heats a slightly inclined substrate with 2–6 degrees off, more than 1000° C. to form the double steps. A second method employs a silicon epitaxial substrate with double steps formed by growing the silicon epitaxial layer by 5 $\mu$m or more. It is preferable that the IC substrate 1a be a low-resistance substrate.

The (110) silicon substrate is subjected to the RCA cleaning process (the cleaning method developed by RCA Corp. using hydrogen peroxide liquid as a base), followed by transporting it to a film deposition apparatus quickly. Subsequently, the clean surface is obtained by passing it through a vacuum of more than 800° C. and less than $1.33 \times 10^{-6}$ Pa ($10^{-8}$ torr), followed by the termination processing to suppress the activity of the surface. As the termination processing, the following two methods are applicable.

A first method forms SrSi, strontium silicide, by slight film deposition of metal strontium in k-cell.

A second method introduces As vapor to a clean surface in a chamber, thereby achieving As termination of the surface to suppress the activity.

An insulating layer 3 is formed on the (110) silicon substrate 1a by the film deposition using a PLD method after completing the termination processing by one of the foregoing two methods. The dielectric layer 3 consists of a 200 nm thick thin film with a high dielectric constant composed of $Ba_{0.5}Sr_{0.5}TiO_3$ or the like. The (100) $Ba_{0.5}Sr_{0.5}TiO_3$ is epitaxially grown on the (110) silicon by the higher-order epitaxy, forming a BST thin film with a dielectric constant of 400 or more.

After forming the dielectric layer 3, an upper electrode layer 4 is formed. It is preferable that the dielectric layer 3 and the upper electrode layer 4 have high adhesion, and a 200 nm thick Pt thin film is deposited by the sputtering method. Afterward, a thin film coil 7 is formed on the upper electrode 4 by the following method.

First, polyimide is coated on a capacitor surface, thereby forming an insulating layer 5. Next, a magnetic layer 6 with a composition of CoTaHfPd or the like is film deposited by sputtering. Subsequently, a 30 µm thick photosensitive polyimide is coated, on which a coil pattern is formed. Using the polyimide layer as a type, the copper coil is plated by electrolysis plating.

After removing the polyimide layer by plasma etching, insulating magnetic gel 9 containing permalloy or the like is filled between coil wires and the upper portion of the coil. After molding it by a mold layer 14, a buried wiring 10 is connected to the center of the coil, completing the fabrication process of the thin film coil and composite integrated circuit. Instead of using the magnetic gel 9, the structure can be constructed as the conventional thin film coil by film depositing ferromagnetic thin film on the coil, again, followed by heat treatment in an magnetic field to increase the magnetic susceptibility.

As for the performance of the foregoing embodiment, the capacitor section can achieve a dielectric constant such as 1 µF or more for a square with a side length of 5 mm because of the high dielectric constant resulting from the dielectric layer grown all over the epitaxial surface. In addition, since the low-resistance substrate is used as the immediately lower electrode, a very low equivalent series resistance (ESR) is obtained which is equal to or less than 100 mΩ. As for the coil, using the magnetic gel can facilitate the fabrication process, and enables an inductance of more than 1 H.

The performance is enough for the output filter of a DC-DC converter with an input voltage of about 5 V and an output voltage of about 3 V, for example. In addition, the thickness of the composite circuit combining the thin film capacitor, thin film coil and MOS can be reduced to an order of 300 micrometers using the CMP, thereby making it possible to miniaturize the power supply circuit greatly.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A composite integrated circuit comprising:
   a semiconductor silicon substrate; and
   an oxide thin film that has at least one of electrical, magnetic and optical functions, and is formed directly on said semiconductor silicon substrate, a surface of terminated semiconductor silicon substrate, or a buffer layer formed on said semiconductor silicon substrate, wherein
   said semiconductor silicon substrate consists of a (110) silicon substrate with a double step (level difference of 3.84 Å) surface.

2. The composite integrated circuit as claimed in claim 1, wherein said oxide thin film layer is higher-order epitaxial layer.

3. A composite integrated circuit comprising:
   a first semiconductor substrate having its first principal surface provided with an integrated circuit;
   a second semiconductor substrate having its first principal surface provided with a thin film having at least one of electrical, magnetic and optical functions; and
   a structure for adhering a second principal surface of said first semiconductor substrate to a second principal surface of said second semiconductor substrate, wherein
   said first semiconductor substrate and said second semiconductor substrate are laminated to have different plane orientations.

4. The composite integrated circuit as claimed in claim 3, wherein said oxide thin film layer is epitaxially grown with respect to said semiconductor silicon substrate by higher-order epitaxy.

5. The composite integrated circuit as claimed in claim 4, wherein said second semiconductor substrate consists of a conductive substrate.

6. The composite integrated circuit as claimed in claim 3, wherein said second semiconductor substrate consists of a conductive substrate.

* * * * *